US012672257B2

(12) United States Patent
Gao et al.

(10) Patent No.: US 12,672,257 B2
(45) Date of Patent: Jun. 30, 2026

(54) ELECTRONIC ASSEMBLY AND ELECTRONIC DEVICE

(71) Applicant: Huawei Digital Power Technologies Co., Ltd., Shenzhen (CN)

(72) Inventors: Qiang Gao, Dongguan (CN); Longhe Wei, Dongguan (CN); Yongqi Qiu, Dongguan (CN); Jihui Liu, Dongguan (CN); Xinquan Huang, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 248 days.

(21) Appl. No.: 18/491,585

(22) Filed: Oct. 20, 2023

(65) Prior Publication Data

US 2024/0138103 A1    Apr. 25, 2024
US 2024/0237276 A9    Jul. 11, 2024

(30) Foreign Application Priority Data

Oct. 21, 2022    (CN) .......................... 202211291005.5

(51) Int. Cl.
*H05K 7/20*      (2006.01)
*H05K 1/02*      (2006.01)

(52) U.S. Cl.
CPC ....... *H05K 7/20254* (2013.01); *H05K 1/0203* (2013.01); *H05K 7/20263* (2013.01); *H05K 2201/064* (2013.01)

(58) Field of Classification Search
CPC ........... H05K 7/20254; H05K 7/20772; H05K 7/20781; H05K 7/20809; H05K 7/20927;
(Continued)

(56) References Cited

U.S. PATENT DOCUMENTS 5,375,655 A   *   12/1994   Lee ....................... H01L 23/467
                                               165/185
9,423,192 B2 *   8/2016   Tsoi ...................... F28F 21/084
(Continued)

FOREIGN PATENT DOCUMENTS

CN       107492922 A     12/2017
CN       107966056 A      4/2018
(Continued)

*Primary Examiner* — Adam B Dravininkas
(74) *Attorney, Agent, or Firm* — Leydig, Voit & Mayer, Ltd.

(57) ABSTRACT

An electronic assembly includes a circuit board assembly and a liquid cold plate. The circuit board assembly includes a board, a first heat-generating component, and a second heat-generating component, where the first heat-generating component and the second heat-generating component are disposed on the board. The liquid cold plate includes a liquid inlet and a liquid outlet. The liquid cold plate includes a first cooling region and a second cooling region, where the second cooling region is closer to the liquid outlet than the first cooling region. A heat dissipation capability of the first cooling region is stronger than that of the second cooling region. A heat-generating density of the first heat-generating component is greater than that of the second heat-generating component, the first heat-generating component is thermally connected to the first cooling region, and the second heat-generating component is thermally connected to the second cooling region.

17 Claims, 6 Drawing Sheets

(58) Field of Classification Search

CPC .............. H05K 7/20818; H01L 23/473; H01L 2225/06589; H01L 23/46; H01L 23/3672; H01L 23/3677; H01L 23/367

See application file for complete search history.

(56)                    References Cited

U.S. PATENT DOCUMENTS

| | | | | |
|---|---|---|---|---|
| 2006/0126296 A1* | 6/2006 | Campbell | ............ | H05K 7/2079 |
| | | | | 361/700 |
| 2009/0080159 A1* | 3/2009 | Ippoushi | ............... | H01L 23/473 |
| | | | | 361/702 |
| 2018/0168075 A1* | 6/2018 | Okazaki | ............ | H05K 7/20927 |
| 2019/0208672 A1* | 7/2019 | Yamabe | ................. | H02M 7/48 |
| 2022/0030747 A1* | 1/2022 | Okuno | .................... | F25D 11/02 |
| 2022/0386507 A1* | 12/2022 | Mv | ........................... | H02B 1/56 |
| 2023/0180442 A1* | 6/2023 | Zhou | ................. | H05K 7/20509 |
| 2023/0254995 A1* | 8/2023 | Robinson | ................ | G06F 1/203 |
| | | | | 361/699 |

FOREIGN PATENT DOCUMENTS

| | | | |
|---|---|---|---|
| CN | 110958819 | A | 4/2020 |
| CN | 212064674 | U | 12/2020 |
| CN | 214477402 | U | 10/2021 |
| EP | 2802198 | A2 | 11/2014 |
| EP | 3518413 | A1 | 7/2019 |
| TW | 200816905 | A | 4/2008 |

* cited by examiner

2

15(1)

22

| Capacitor | Common-mode inductor | | Fuse |

25

| Other | Other | | Capacitor |

Relay

| Inductor | Inductor | Inductor |

Fuse

14(1)

Common-mode inductor

| Transformer | Transformer | Transformer |

Capacitor

24

23

21

| IGBT | IGBT | IGBT |

13(1)

200    14(1)    13(1)    11(1)

15(1)

3

23    24    25

ELECTRONIC ASSEMBLY AND ELECTRONIC DEVICE

CROSS-REFERENCE TO RELATED APPLICATIONS

This application claims priority to Chinese Patent Application No. 202211291005.5, filed on Oct. 21, 2022, which is hereby incorporated by reference in its entirety.

TECHNICAL FIELD

This application relates to the field of technologies of heat dissipation devices, and in particular, to an electronic assembly and an electronic device.

BACKGROUND

With rapid development of new-energy vehicles, power of a charging pile tends to gradually increase. A charging module is a core part of the charging pile. Currently, air-cooling heat dissipation is still a mainstream heat dissipation architecture of the charging module. With development of high-power charging modules, heat dissipation requirements of the charging module gradually increase and liquid-cooling heat dissipation is one of mainstream development directions in the future.

FIG. 1 is a schematic diagram of a structure of an electronic assembly according to a conventional technology. As shown in FIG. 1, in the conventional technology, the electronic assembly includes a circuit board assembly 1 and a liquid cold plate 2, where the circuit board assembly 1 includes a board 11 and a heat-generating component 12, and the heat-generating component 12 is disposed on the board 11. There is a liquid-cooling cavity inside the liquid cold plate 2, a liquid-cooling working medium flows in the liquid-cooling cavity, and the liquid cold plate 2 is thermally connected to the heat-generating component 12, so that the liquid-cooling working medium may be used to take away heat generated by the heat-generating component 12, thereby dissipating heat for the heat-generating component 12. A plurality of the heat-generating components 12 are generally disposed in the electronic assembly, and one liquid cold plate 2 is used to dissipate heat for the plurality of the heat-generating components 12. However, in the electronic assembly, heat dissipation densities of the plurality of the heat-generating components 12 may be different, and heat dissipation cannot be pertinently performed. Therefore, a heat dissipation effect is relatively poor, and resources may be prone to be wasted.

SUMMARY

This application provides an electronic assembly and an electronic device. In this solution, heat dissipation capabilities of different regions of a liquid cold plate are appropriately utilized to improve an effect of dissipating heat for a heat-generating component and also reduce energy consumption.

According to a first aspect, this application provides an electronic assembly, where the electronic assembly includes a circuit board assembly and a liquid cold plate. The circuit board assembly includes a board, a first heat-generating component, and a second heat-generating component, where the first heat-generating component and the second heat-generating component are disposed on the board. Specifically, the board may have a circuit pattern, and the first heat-generating component and the second heat-generating component may be electrically connected to the circuit pattern. The liquid cold plate includes a liquid inlet and a liquid outlet. A cooling working medium flows into a liquid-cooling cavity of the liquid cold plate from the liquid inlet, and then flows out of the liquid cold plate from the liquid outlet. In this way, the liquid cold plate may be configured to dissipate heat for the circuit board assembly. The liquid cold plate includes a first cooling region and a second cooling region, where the second cooling region is closer to the liquid outlet than the first cooling region. In other words, the cooling working medium first flows through the first cooling region from the liquid inlet, and then flows to the second cooling region, so that a heat dissipation capability of the first cooling region is stronger than that of the second cooling region. A heat-generating density of the first heat-generating component is greater than that of the second heat-generating component, the first heat-generating component is thermally connected to the first cooling region, and the second heat-generating component is thermally connected to the second cooling region. The first cooling region is used to dissipate heat for the first heat-generating component, and the second cooling region is used to dissipate heat for the second heat-generating component, so that a heat dissipation capability of the liquid cold plate can be appropriately utilized to improve effects of dissipating heat for the first heat-generating component and the second heat-generating component, and also reduce energy consumption.

In a specific technical solution, in the first cooling region, there are a plurality of first heat dissipation fins, configured to improve the heat dissipation capability of the first cooling region; and, in the second cooling region, there are a plurality of second heat dissipation fins, configured to improve the heat dissipation capability of the second cooling region. A density of the plurality of first heat dissipation fins is greater than that of the plurality of second heat dissipation fins, so that the heat dissipation capability of the first cooling region is further stronger than that of the second cooling region.

In a specific technical solution, the electronic assembly further includes a shovel tooth radiator, where the shovel tooth radiator is disposed in the first cooling region, and the shovel tooth radiator is fixedly connected to the liquid cold plate. A gap between adjacent fins of the shovel tooth radiator may be made relatively small, and then a density of the plurality of fins of the shovel tooth radiator is relatively high. Therefore, a heat dissipation capability of the shovel tooth radiator is relatively strong, to help further improve the heat dissipation capability of the first cooling region.

In another specific technical solution, the electronic assembly further includes a spoiler, where the spoiler includes a plurality of protrusion structures. The first cooling region of the liquid cold plate includes a plurality of fourth heat dissipation fins; each protrusion structure in the plurality of protrusion structures and each fourth heat dissipation fin in the plurality of fourth heat dissipation fins are sequentially disposed spaced from each other; and there is a preset gap between a protrusion structure and a fourth heat dissipation fin that are adjacent. When a liquid-cooling working medium flows in the first cooling region, the liquid-cooling working medium is squeezed and disturbed by the protrusion structures, so that a flow rate of the liquid-cooling working medium increases, and a vortex is formed, to improve a heat exchange capability of the liquid cold plate, thereby improving a heat dissipation effect of the first cooling region on the first heat-generating component. In addition, the protrusion structures of the spoiler disturb the liquid-cooling working medium, so that the liquid-cooling working medium strikes the fourth heat dissipation fins. This may also improve the heat exchange capability of the liquid cold plate.

A shape of each protrusion structure in the plurality of protrusion structures of the spoiler is not limited, and may be a trapezoidal tooth or a cambered tooth. The two tooth shapes each have a relatively good disturbing effect, and can improve the heat dissipation capability of the first cooling region. In addition, the two tooth shapes may be prepared by using a press forming process, and the preparation process is relatively simple.

In a specific embodiment, the liquid cold plate may include two parts: a die-cast liquid cold plate and a cover plate. The die-cast liquid cold plate is prepared by using a die casting process, and the preparation process is relatively simple. The die-cast liquid cold plate is covered by the cover plate to form a passageway, and the liquid-cooling working medium flows in the passageway to dissipate heat for a heat-generating component. The spoiler includes a positioning piece, and the positioning piece is connected to the die-cast liquid cold plate in a position limiting manner, so that positions of the spoiler and the die-cast liquid cold plate are relatively fixed. In addition, the spoiler is crimped between the cover plate and the die-cast liquid cold plate. In this solution, an installation manner of the spoiler is relatively simple, an installation structure is reliable, and water leakage is not prone to occur.

During specific disposition of the first heat-generating component, a distance between two surfaces that are of the first cooling region and the first heat-generating component and that face each other may be less than or equal to 0.1 mm. In other words, a distance between a surface that is of the first cooling region and that faces the first heat-generating component and a surface that is of the first heat-generating component and that faces the first cooling region is less than or equal to 0.1 mm, to help enable the first heat-generating component to be thermally connected to the first cooling region, and shorten a thermal conduction path between the first heat-generating component and the first cooling region, thereby improving efficiency of heat exchange between the first heat-generating component and the first cooling region.

Specifically, the first heat-generating component is thermally connected to the first cooling region by using a first thermal connection layer. The first thermal connection layer is flexible, and can increase a degree of adhesion between the first heat-generating component and the first cooling region, increase a heat exchange area, and also improve heat exchange efficiency.

The first thermal connection layer may be a thermal connection layer such as silicone grease, curing adhesive, or thermally conductive film. The first thermal connection layer made of the foregoing material may be made relatively thin and has relatively high thermal conductivity, so that the efficiency of heat exchange between the first heat-generating component and the first cooling region may be improved.

During specific disposition of the second heat-generating component, a gluing groove is disposed on a side that is of the second cooling region and that faces the second heat-generating component, the second heat-generating component is located in the gluing groove, and the second heat-generating component is thermally connected to the gluing groove by using pouring sealant. Compared with disposition of the first heat-generating component, a gap between the second heat-generating component and the gluing groove may be relatively large, so that a manufacturing tolerance of the liquid cold plate may be relatively large.

In a specific technical solution, one second heat-generating component is accommodated in one gluing groove. In this way, the liquid cold plate may have a plurality of gluing grooves, where there are quite many groove walls of the gluing grooves, to increase a heat dissipation area of the liquid cold plate, thereby helping improve efficiency of dissipating heat for the second heat-generating component.

In addition, a gap between the second heat-generating component and the gluing groove may be less than or equal to a preset width. In this way, a distance between the second heat-generating component and the gluing groove is relatively short, so that a thermal conduction path between the second heat-generating component and the gluing groove is relatively short, and thermal conduction efficiency is relatively high, thereby helping improve an effect of heat dissipation between the second heat-generating components.

In a further technical solution, the circuit board assembly further includes a third heat-generating component. The third heat-generating component is also disposed on the board, and the heat-generating density of the second heat-generating component is greater than that of the third heat-generating component. Correspondingly, the liquid cold plate further includes a third cooling region, and the third cooling region and the first cooling region are respectively located on two sides of the second cooling region. In other words, the third cooling region, the second cooling region, and the first cooling region are sequentially arranged in a direction from the liquid outlet to the liquid inlet, and their heat dissipation capabilities sequentially increase. The third heat-generating component is thermally connected to the third cooling region. In this solution, positions are arranged based on heat-generating densities of the heat-generating components, so that the liquid-cooling working medium may be used, to a maximum extent, to dissipate heat for the heat-generating components of the electronic assembly, thereby reducing power consumption of a liquid-cooling system.

During specific disposition of the third heat-generating component, a distance between two surfaces that are of the third cooling region and the third heat-generating component and that face each other is less than or equal to 2.5 mm, that is, a gap between the third heat-generating component and the third cooling region is less than or equal to 2.5 mm. In this solution, there is a relatively wide available range of a gap between a surface of the third heat-generating component and a surface of the third cooling region, to help absorption of a tolerance.

During specific disposition of the third heat-generating component, the third heat-generating component is thermally connected to the third cooling region by using a second thermal connection layer. The second thermal connection layer is flexible, and can increase a degree of adhesion between the third heat-generating component and the third cooling region, increase a heat exchange area, and also improve heat exchange efficiency. The second thermal connection layer can also absorb a tolerance, protect the third heat-generating component, and reduce a probability of the third heat-generating component to be damaged by collision.

The second thermal connection layer may be a thermally conductive layer such as a thermal pad, thermally conductive gel, or thermally conductive adhesive tape. The second thermal connection layer has relatively high thermal conductivity, and can improve efficiency of heat exchange between the third heat-generating component and the third cooling region.

The liquid cold plate includes a plurality of passageways, where an extension direction of the passageway intersects with a direction in which the liquid inlet faces the liquid outlet, the plurality of passageways are sequentially connected in series, and columnar teeth are disposed between two adjacent passageways. Disposing the columnar teeth between two adjacent passageways is equivalent to disposition at a turning point of the liquid-cooling working medium, so that a speed and a temperature of the cooling working medium are relatively uniform at each turning point.

In another technical solution, the circuit board assembly includes at least two first heat-generating components, and the first cooling region includes a main passageway and at least two sub-passageways. Each sub-passageway is connected to the main passageway, and adjacent sub-passageways are disposed in parallel. Therefore, temperatures of the cooling working medium in the sub-passageways are relatively close to each other, and heat dissipation capabilities of the sub-passageways are close to each other. The sub-passageways are thermally connected to the first heat-generating components in a one-to-one correspondence manner, so that the first cooling region has relatively close capabilities of dissipating heat for the first heat-generating components. In addition, lengths of the sub-passageways are relatively short, and flow resistance of the cooling working medium in the sub-passageways is relatively small, helping improve a flow rate of the cooling working medium and improve heat exchange efficiency.

In a specific technical solution, the electronic assembly may be a charging module.

According to a second aspect, this application provides an electronic device, where the electronic device includes a housing and the electronic assembly according to the first aspect. The electronic assembly is disposed at the housing. In this technical solution, a heat-generating component of the electronic device may be arranged based on a heat dissipation capability of a liquid cold plate, thereby improving an effect of dissipating heat for the heat-generating component.

The electronic device may be specifically a charging pile.

REFERENCE NUMERALS

Figure 1:
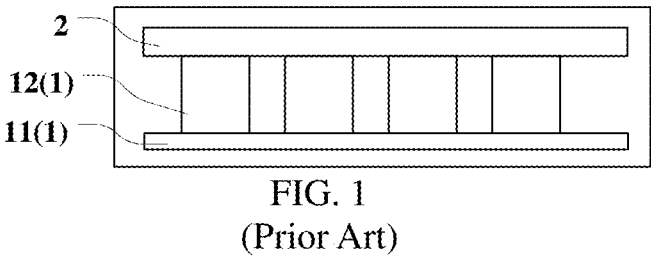
FIG. 1 is a schematic diagram of a structure of an electronic assembly according to a conventional technology.

100: housing; 200: electronic assembly;
300: water tank; 400: water pump;
500: heat exchanger; 1: circuit board assembly;
11: board; 12: heat-generating component;
13: first heat-generating component; 14: second heat-generating component;
15: third heat-generating component; 2: liquid cold plate;
21: liquid inlet; 22: liquid outlet;
23: first cooling region; 231: first heat dissipation fin;
232: fourth heat dissipation fin; 233: main passageway;
234: sub-passageway; 24: second cooling region;
241: second heat dissipation fin; 242: gluing groove;
25: third cooling region; 251: third heat dissipation fin;
26: die-cast liquid cold plate; 27: cover plate;
28: columnar tooth; 3: shovel tooth radiator;
4: spoiler; 41: protrusion structure;
42: positioning piece.

DESCRIPTION OF EMBODIMENTS

Terms used in the following embodiments are merely intended to describe specific embodiments, but not to limit this application. The terms "one", "a", and "the", "the foregoing", "this", and "the one" in a singular form as used in this specification and the appended claims of this application are also intended to include expressions such as "one or more", unless otherwise specified clearly in the context.

Reference to "an embodiment", "a specific embodiment", or the like described in this specification indicates that one or more embodiments of this application include a specific feature, structure, or characteristic described with reference to the embodiment. The terms "include", "contain", "have", and their variants all mean "include but are not limited to", unless otherwise especially emphasized.

For ease of understanding an electronic assembly and an electronic device provided in embodiments of this application, the following first describes an application scenario of the electronic assembly and the electronic device. With development of electronic technologies, the power of a heat-generating component in an electronic assembly tends to be increasingly higher, and more heat is generated.

Therefore, an electronic device has an increasingly-higher heat dissipation requirement. To improve heat dissipation efficiency, a liquid-cooling heat dissipation technology is more and more widely applied, where a liquid cold plate is used to dissipate heat for a heat-generating component of an electronic device.

Since heat-generating components have different operating power and different heat-generating efficiency, their heat dissipation requirements are also different. However, heat dissipation capabilities of liquid cold plates are consistent, and then heat dissipation cannot be performed based on a heat dissipation requirement of a heat-generating component. This may easily cause a resource waste.

To resolve the foregoing problem, this application provides an electronic assembly and an electronic device. To make the objectives, technical solutions, and advantages of this application clearer, the following further describes this application in detail with reference to the accompanying drawings.

Figure 2:
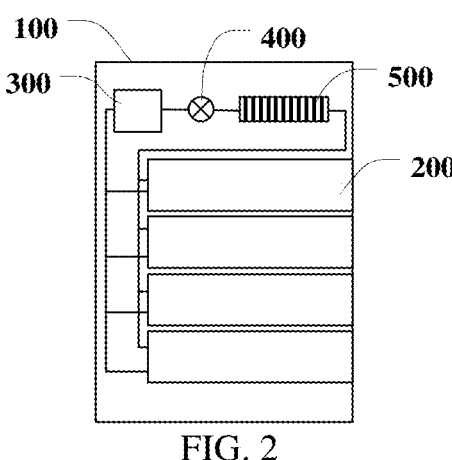
FIG. 2 is a schematic diagram of a structure of an electronic device according to an embodiment of this application.

FIG. 2 is a schematic diagram of a structure of an electronic device according to an embodiment of this application. As shown in FIG. 2, this application provides an electronic device. The electronic device includes a housing 100 and an electronic assembly 200, where the electronic assembly 200 is installed at the housing 100. In a specific embodiment, the electronic assembly 200 may be installed inside the housing 100, or may be disposed at another position of the housing 100. This is not limited in this application. The electronic device may further include a water tank 300, a water pump 400, and a heat exchanger 500. They are configured to dissipate heat for or cool the electronic assembly 200. Specifically, the water tank 300 is configured to hold a cooling working medium, the water pump 400 is configured to provide power for the cooling working medium to flow, and the heat exchanger 500 is configured to cool the cooling working medium.

Figure 3:
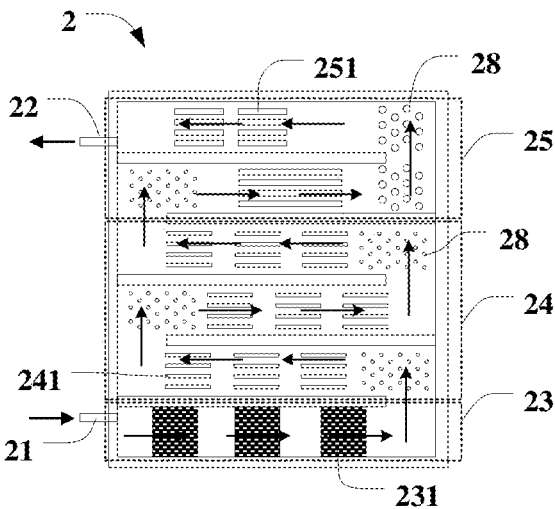
FIG. 3 is a schematic diagram of a structure of a liquid cold plate according to an embodiment of this application.
Figures 4, 5:
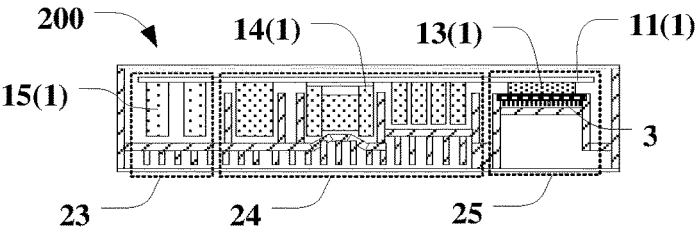
FIG. 4 is a schematic diagram of a structure of an electronic assembly according to an embodiment of this application.
FIG. 5 is a schematic cross-sectional view of a structure of an electronic assembly according to an embodiment of this application.

FIG. 3 is a schematic diagram of a structure of a liquid cold plate according to an embodiment of this application. FIG. 4 is a schematic diagram of a structure of an electronic assembly according to an embodiment of this application. FIG. 5 is a schematic cross-sectional view of a structure of an electronic assembly according to an embodiment of this application. As shown in FIG. 3 to FIG. 5, the electronic assembly 200 includes a circuit board assembly 1 and a liquid cold plate 2, where the circuit board assembly 1 includes a board 11, a first heat-generating component 13, and a second heat-generating component 14. The board 11 may be specifically a circuit board. The first heat-generating component 13 and the second heat-generating component 14 are disposed on the board 11. In a specific embodiment, the first heat-generating component 13 and the second heat-generating component 14 may be electrically connected to the board 11, or may be fastened on the board 11. A heat-generating density of the first heat-generating component 13 is different from that of the second heat-generating component 14, where the heat-generating density refers to a quantity of heat emitted in a unit area of the heat-generating component in a unit time. Specifically, the heat-generating density of the first heat-generating component 13 is greater than that of the second heat-generating component 14.

The liquid cold plate 2 includes a liquid-cooling cavity, and a liquid inlet 21 and a liquid outlet 22 that are connected to the liquid-cooling cavity. The cooling working medium flows into the liquid-cooling cavity of the liquid cold plate 2 from the liquid inlet 21, and flows out of the liquid-cooling cavity of the liquid cold plate 2 from the liquid outlet 22. In other words, in the liquid-cooling cavity of the liquid cold plate 2, the cooling working medium flows from the liquid inlet 21 to the liquid outlet 22. The liquid cold plate 2 includes a first cooling region 23 and a second cooling region 24, and the second cooling region 24 is closer to the liquid outlet 22 than the first cooling region 23. The cooling working medium enters the liquid-cooling cavity from the liquid inlet 21, first passes through the first cooling region 23, and then passes through the second cooling region 24. It may be understood that a temperature of the cooling working medium in the first cooling region 23 is lower than a temperature of the cooling working medium in the second cooling region 24.

The first heat-generating component 13 is thermally connected to the first cooling region 23, and the second heat-generating component 14 is thermally connected to the second cooling region 24. Because the cooling working medium first flows through the first cooling region 23 and then flows through the second cooling region 24, a heat dissipation capability of the first cooling region 23 is stronger than that of the second cooling region 24. The first cooling region 23 is used to dissipate heat for the first heat-generating component 13, and the second cooling region 24 is used to dissipate heat for the second heat-generating component 14, so that a heat dissipation capability of the liquid cold plate 2 can be appropriately utilized to improve effects of dissipating heat for the first heat-generating component 13 and the second heat-generating component 14, and also reduce energy consumption.

It is worth noting that, in embodiments of this application, "a thermal connection" between A and B means that heat exchange may be performed between A and B; and specifically, A and B may be directly connected to each other to perform heat exchange; or A and B may be indirectly connected to each other by using a thermally conductive structure such as a thermally conductive layer, to perform heat exchange. To sum up, it suffices if A and B can perform heat exchange with each other.

Refer to FIG. 3 to FIG. 5 again. The circuit board assembly 1 further includes a third heat-generating component 15, where the third heat-generating component 15 is also disposed on the board 11. The heat-generating density of the second heat-generating component 14 is greater than that of the third heat-generating component 15, and heat-generating densities of the first heat-generating component 13, the second heat-generating component 14, and the third heat-generating component 15 decrease in turn. The liquid cold plate 2 further includes a third cooling region 25, and the third cooling region 25 and the first cooling region 23 are disposed on two sides of the second cooling region 24. In other words, the third cooling region 25, the second cooling region 24, and the first cooling region 23 are sequentially arranged in a direction from the liquid outlet 22 to the liquid inlet 21, and their heat dissipation capabilities increase in turn. The third heat-generating component 15 is thermally connected to the third cooling region 25. In embodiments of this application, positions are arranged based on heat-generating densities of the heat-generating components, so that the liquid-cooling working medium may be used, to a maximum extent, to dissipate heat for the heat-generating components of the electronic assembly 200, thereby reducing power consumption of a liquid-cooling system.

Refer to FIG. 3 to FIG. 5 again. In a specific embodiment, there are a plurality of first heat dissipation fins 231 in the first cooling region 23, a plurality of second heat dissipation fins 241 in the second cooling region 24, and a plurality of third heat dissipation fins 251 in the third cooling region 25, so as to improve heat dissipation capabilities of the first cooling region 23, the second cooling region 24, and the third cooling region 25, thereby improving the heat dissipation capability of the liquid cold plate 2. In a specific embodiment, a density of the plurality of first heat dissipation fins 231 in the first cooling region 23 is greater than that of the plurality of second heat dissipation fins 241 in the second cooling region 24, and the density of the plurality of second heat dissipation fins 241 in the second cooling region 24 is greater than that of the plurality of third heat dissipation fins 251 in the third cooling region 25. In this way, the heat dissipation capability of the first cooling region 23 is further stronger than that of the second cooling region 24, and the heat dissipation capability of the second cooling region 24 is further stronger than that of the third cooling region 25, so as to improve a capability of dissipating heat for the first heat-generating component 13, appropriately utilize the liquid-cooling working medium, and save energy consumption.

In a specific embodiment, the liquid cold plate 2 may be prepared by using a die casting process, to simplify a manufacturing process of the liquid cold plate 2. Because it is difficult to manufacture the plurality of first heat dissipation fins 231 whose density is relatively high on the liquid cold plate 2 that is prepared by using the die casting process, a quantity of first heat dissipation fins 231 in the first cooling region 23 is limited, a heat dissipation area is limited, and a heat dissipation requirement of the first heat-generating component 13 can hardly be met.

Figure 6:
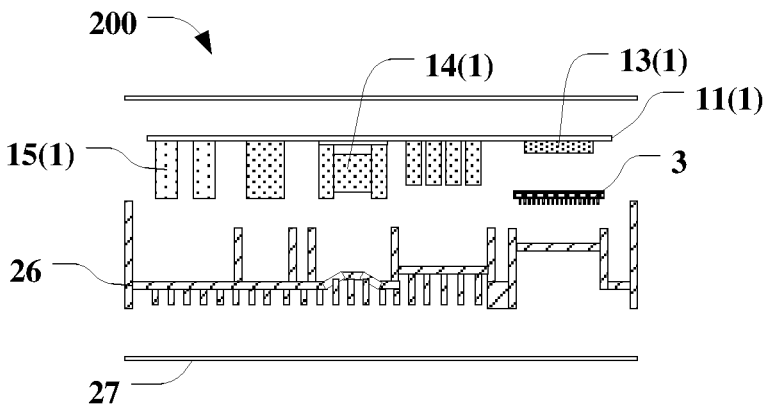
FIG. 6 is a schematic exploded view of a structure of an electronic assembly according to an embodiment of this application.

FIG. 6 is a schematic exploded view of a structure of an electronic assembly according to an embodiment of this application. As shown in FIG. 3, FIG. 5, and FIG. 6, in an embodiment, a shovel tooth radiator 3 may be disposed in the first cooling region 23, where the shovel tooth radiator 3 is fixedly connected to the liquid cold plate 2. The shovel tooth radiator 3 has a plurality of fins, a passageway of the liquid-cooling working medium is formed between the shovel tooth radiator 3 and the liquid cold plate 2, and the fins are located in the passageway. In a specific embodiment, the shovel tooth radiator 3 may be fixedly connected to the liquid cold plate 2 in a friction-stir welding manner. A gap between adjacent fins of the shovel tooth radiator 3 may be made relatively small, and then a density of the plurality of fins of the shovel tooth radiator 3 is relatively high. Therefore, a heat dissipation capability of the shovel tooth radiator 3 is relatively strong, to help further improve the heat dissipation capability of the first cooling region 23.

Figure 7:
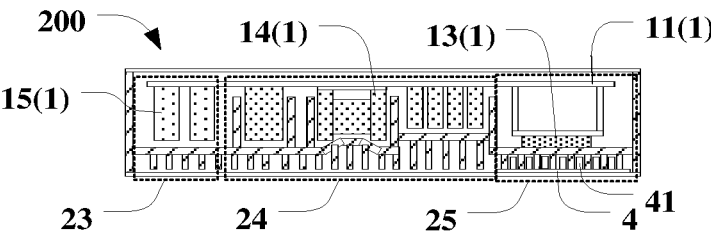
FIG. 7 is another schematic diagram of a structure of an electronic assembly according to an embodiment of this application.
Figure 8:
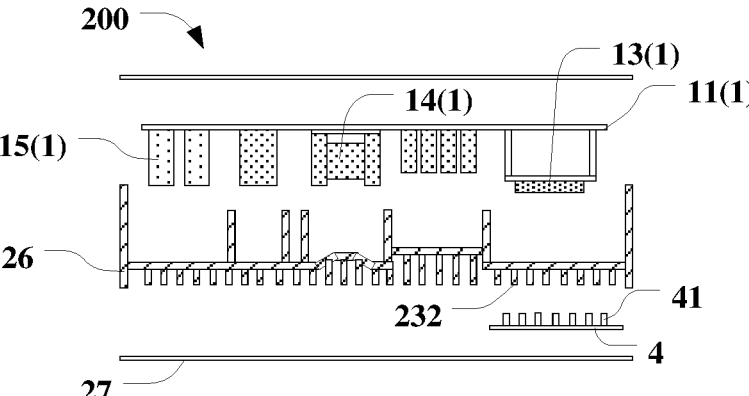
FIG. 8 is another schematic exploded view of a structure of an electronic assembly according to an embodiment of this application.
Figure 9:
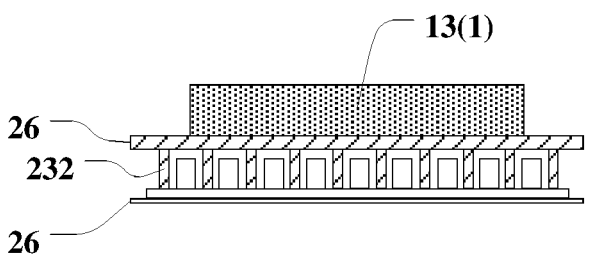
FIG. 9 is a partial enlargement view of an electronic assembly according to an embodiment of this application.

In addition, FIG. 7 is another schematic diagram of a structure of an electronic assembly according to an embodiment of this application, and FIG. 8 is another schematic exploded view of a structure of an electronic assembly according to an embodiment of this application. As shown in FIG. 7 and FIG. 8, in an embodiment, the electronic assembly 200 may further include a spoiler 4, where the spoiler 4 is specifically disposed in the first cooling region 23 of the liquid cold plate 2. FIG. 9 is a partial enlargement view of an electronic assembly according to an embodiment of this application. As shown in FIG. 9, the spoiler 4 includes a plurality of protrusion structures 41, the first cooling region 23 includes a plurality of fourth heat dissipation fins 232, and there is a preset gap between two adjacent fourth heat dissipation fins 232, to form a passageway for the liquid-cooling working medium. The liquid-cooling working medium flows between two adjacent fourth heat dissipation fins 232. Each protrusion structure 41 in the plurality of protrusion structures 41 and each fourth heat dissipation fin 232 in the plurality of fourth heat dissipation fins 232 are sequentially disposed spaced from each other. In other words, the protrusion structures 41 are located in the passageway. There is a preset gap between a protrusion structure 41 and a fourth heat dissipation fin 232 that are adjacent, so that the liquid-cooling working medium can flow through the passageway by using the preset gap. In this solution, when flowing between adjacent fourth heat dissipation fins 232, the liquid-cooling working medium is squeezed and disturbed by the protrusion structures 41, so that a flow rate of the liquid-cooling working medium increases, and a vortex is formed. The spoiler 4 can increase a flow rate of the liquid-cooling working medium, to improve a heat exchange capability of the liquid cold plate 2, thereby improving a heat dissipation effect of the first cooling region 23 on the first heat-generating component 13. In addition, the protrusion structures 41 of the spoiler 4 may disturb the liquid-cooling working medium, so that the liquid-cooling working medium strikes the fourth heat dissipation fins 232. This may also improve the heat exchange capability of the liquid cold plate 2.

An installation manner of the spoiler 4 is not limited. As shown in FIG. 7 and FIG. 8, the liquid cold plate 2 includes a die-cast liquid cold plate 26 and a cover plate 27. The die-cast liquid cold plate 26 is covered by the cover plate 27 to form a passageway. The passageway is the liquid-cooling cavity of the liquid cold plate 2, and the liquid-cooling working medium flows in the passageway. In a specific embodiment, the die-cast liquid cold plate 26 and the cover plate 27 may be connected and fixed by using a friction-stir welding process. The spoiler 4 further includes a positioning piece 42, where the positioning piece 42 may be specifically of a bent structure to facilitate molding. The positioning piece 42 is connected to the die-cast liquid cold plate 26 in a position limiting manner. For example, the positioning piece 42 is clamped to the fourth heat dissipation fin 232 of the die-cast liquid cold plate 26, so that a position of the spoiler 4 and a position of the fourth heat dissipation fin 232 of the die-cast liquid cold plate 26 are relatively fixed. The cover plate 27 crimps the spoiler 4 onto the die-cast liquid cold plate 26, that is, the cover plate 27 and the die-cast liquid cold plate 26 are sandwiched on two sides of the spoiler 4. In this solution, an installation manner of the spoiler 4 is relatively simple, an installation structure is reliable, and water leakage does not easily occur.

In another embodiment, the spoiler 4 may also be fixed on the die-cast liquid cold plate 26 in a manner of welding or the like, provided that the spoiler 4 is fixed onto the liquid cold plate 2.

Figure 10:
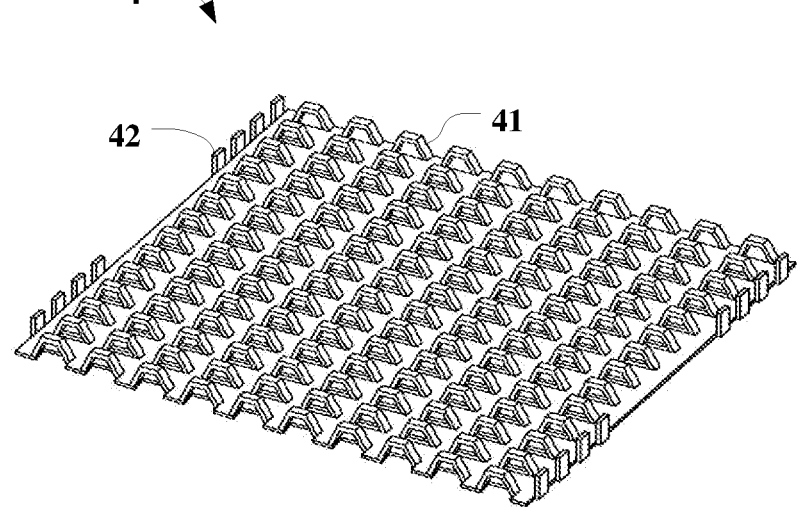
FIG. 10 is a schematic diagram of a structure of a spoiler according to an embodiment of this application.
Figure 11:
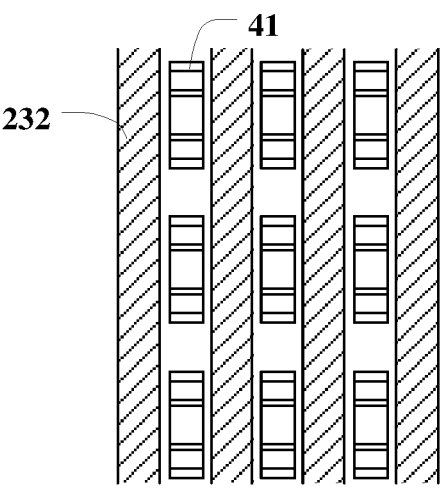
FIG. 11 is a schematic partial top view of a structure of a liquid cold plate according to an embodiment of this application.

The protrusion structure 41 of the spoiler 4 is not limited. FIG. 10 is a schematic diagram of a structure of a spoiler 4 according to an embodiment of this application. FIG. 11 is a schematic partial top view of a structure of a liquid cold plate according to an embodiment of this application. As shown in FIG. 10 and FIG. 11, in an embodiment, the protrusion structure 41 of the spoiler 4 may be a trapezoid tooth. The spoiler 4 may be specifically prepared by using a press forming process. The preparation process is relatively simple, and a flow disturbing effect is relatively good, so that the heat dissipation capability of the liquid cold plate 2 can be substantially improved. In addition, the spoiler 4 in this solution has a strong anti-deformation capability, and can withstand long-term impact of a water flow, thereby improving a service life of the spoiler 4.

Figure 12:
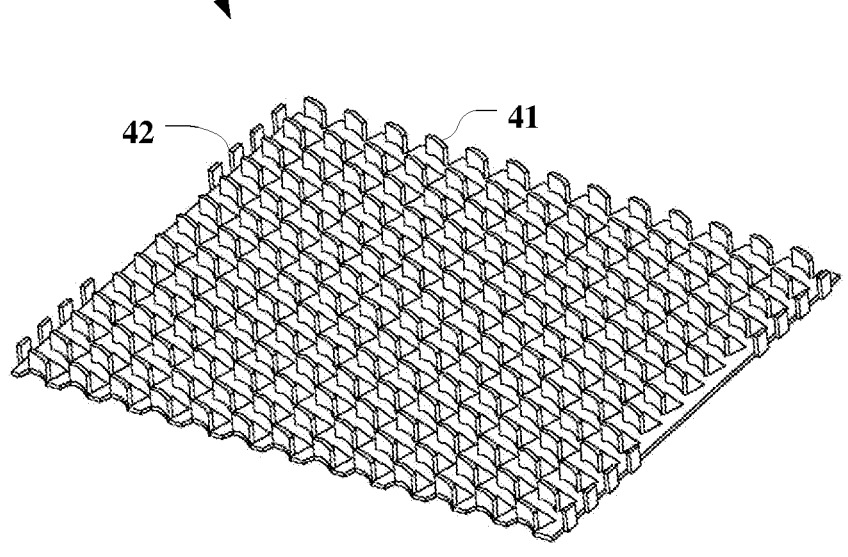
FIG. 12 is another schematic diagram of a structure of a spoiler according to an embodiment of this application.
Figure 13:
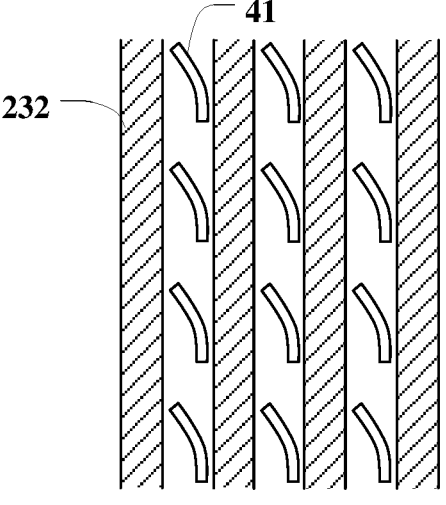
FIG. 13 is another schematic partial top view of a structure of a liquid cold plate according to an embodiment of this application.

FIG. 12 is another schematic diagram of a structure of a spoiler 4 according to an embodiment of this application. FIG. 13 is another schematic partial top view of a structure of a liquid cold plate according to an embodiment of this application. As shown in FIG. 12 and FIG. 13, in another embodiment, the protrusion structure 41 of the spoiler 4 may be a cambered tooth. The spoiler 4 may also be specifically prepared by using a press forming process. The preparation process is relatively simple, and a flow disturbing effect is relatively good, so that the heat dissipation capability of the liquid cold plate 2 can be substantially improved. In addition, the spoiler 4 in this solution also has a strong anti-deformation capability, and can also withstand long-term impact of a water flow, thereby improving a service life of the spoiler 4.

Figure 14:
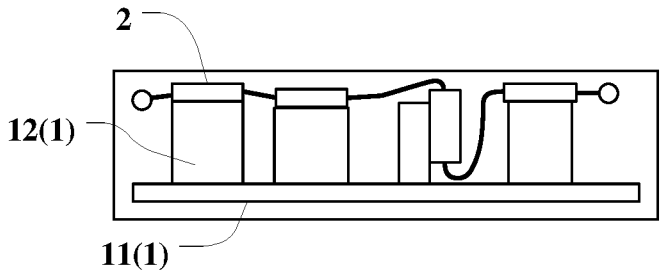
FIG. 14 is another schematic diagram of a structure of an electronic assembly according to a conventional technology.

FIG. 14 is another schematic diagram of a structure of an electronic assembly according to a conventional technology. As shown in FIG. 14, in the conventional technology, to dissipate heat for heat-generating components having different heights in an electronic assembly 200, a plurality of independent liquid cold plates 2 are disposed in the electronic assembly 200, where each liquid cold plate 2 is thermally connected to a heat-generating component. The plurality of independent liquid cold plates 2 are connected by using pipelines, so that a liquid-cooling working medium can flow between the liquid cold plates 2, to dissipate heat for each heat-generating component. In this technical solution, there is a relatively large quantity of liquid cold plates 2, and there is also a relatively large quantity of pipelines connecting the liquid cold plates 2, causing difficult installation. In addition, there is a relatively large quantity of connection interfaces in this solution, and in a vibration environment or during long-term working, a leakage probability is relatively high and reliability is relatively low.

Refer to FIG. 7 and FIG. 8. The liquid cold plate 2 in embodiments of this application is a liquid cold plate 2 prepared by using a die casting process. A shape of the liquid cold plate 2 is arranged based on positions of the heat-generating components. Shapes of sides of the liquid cold plate 2 that face the heat-generating components are adjusted, that is, heights of the sides of the liquid cold plate 2 that face the heat-generating components are different. In this solution, a distance between a heat dissipation surface of the liquid cold plate 2 and each heat-generating component may be relatively short, to help implement a thermal connection and improve efficiency of thermal conduction between the heat-generating component and the liquid cold plate 2.

In a specific embodiment, a distance between a surface that is of the first cooling region 23 of the liquid cold plate 2 and that faces the first heat-generating component 13 and a surface that is of the first heat-generating component 13 and that faces the first cooling region 23 is less than or equal to 0.1 mm. In other words, a gap between the first heat-generating component 13 and the first cooling region 23 is less than or equal to 0.1 mm, to help enable the first heat-generating component 13 to be thermally connected to the first cooling region 23 and shorten a thermal conduction path between the first heat-generating component 13 and the first cooling region 23, thereby improving efficiency of heat exchange between the first heat-generating component 13 and the first cooling region 23.

Specifically, to improve efficiency of heat exchange between the first heat-generating component 13 and the liquid cold plate 2, a first thermal connection layer may be used between the first heat-generating component 13 and a surface of the first cooling region 23, to implement a thermal connection. The first thermal connection layer may be a thermal connection layer such as silicone grease, curing adhesive, or thermally conductive film. The first thermal connection layer may be made relatively thin and has relatively high thermal conductivity, so that the efficiency of heat exchange between the first heat-generating component 13 and the first cooling region 23 may be improved. In addition, the first thermal connection layer is flexible, and can increase a degree of adhesion between the first heat-generating component 13 and the first cooling region 23, increase a heat exchange area, and also improve heat exchange efficiency.

Refer to FIG. 7 and FIG. 8 again. A gluing groove 242 is disposed on a side that is of the second cooling region 24 and that faces the second heat-generating component 14, the second heat-generating component 14 is located in the gluing groove 242, and the second heat-generating component 14 is thermally connected to the gluing groove 242 by using pouring sealant. A surface that is of the second cooling region 24 and that faces the second heat-generating component 14 and the surface that is of the first cooling region 23 and that faces the first heat-generating component 13 may be located on a same plane, or may be located on different planes. In conclusion, a gap between the surface that is of the first cooling region 23 and that faces the first heat-generating component 13 and the first heat-generating component 13 is less than or equal to a first preset value; and a gap between the surface that is of the second cooling region 24 and that faces the second heat-generating component 14 and the second heat-generating component 14 is less than or equal to a second preset value, so that the liquid cold plate 2 can efficiently dissipate heat for the first heat-generating component 13 and the second heat-generating component 14.

During specific disposition of the second heat-generating component 14, one second heat-generating component 14 may be accommodated in one gluing groove 242. In this solution, the liquid cold plate 2 has a plurality of gluing grooves 242, where there are quite many groove walls of the gluing grooves 242, to increase a heat dissipation area of the liquid cold plate 2, thereby helping improve efficiency of dissipating heat for the second heat-generating component 14.

Figure 15:
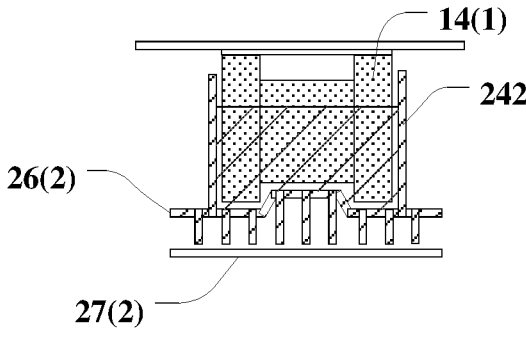
FIG. 15 is a schematic partial view of a structure of an electronic assembly according to an embodiment of this application.

FIG. 15 is a schematic partial view of a structure of an electronic assembly according to an embodiment of this application. As shown in FIG. 15, in a specific embodiment, a die-cast shape inside the gluing groove 242 may be the same as an outer profile of the second heat-generating component 14 accommodated in the gluing groove 242, to help shorten a thermal conduction path, improve thermal conduction efficiency, reduce a quantity of the pouring sealant to reduce a cost, and reduce a weight of the electronic assembly 200.

In addition, in a specific embodiment, a gap between the second heat-generating component 14 and the gluing groove 242 is less than or equal to a preset width. In this way, a distance between the second heat-generating component 14 and the gluing groove 242 is relatively short, so that a thermal conduction path between the second heat-generating component 14 and the gluing groove 242 is relatively short, and thermal conduction efficiency is relatively high, thereby helping improve an effect of heat dissipation between the second heat-generating components 14.

During specific disposition of the third cooling region 25, a surface that is of the third cooling region 25 and that faces the third heat-generating component 15 may be the same as or different from the surface that is of the second cooling region 24 and that faces the second heat-generating component 14. This is not limited in this application. Specifically, a distance between the surface that is of the third cooling region 25 and that faces the third heat-generating component 15 and a surface that is of the third heat-generating component 15 and that faces the third cooling region 25 is less than or equal to 2.5 mm, that is, a gap between the third heat-generating component 15 and the third cooling region 25 is less than or equal to 2.5 mm. In this solution, there is a relatively wide available range of a gap between a surface of the third heat-generating component and a surface of the third cooling region 25, to help absorption of a tolerance. In addition, the gap between the third heat-generating component 15 and the third cooling region 25 is not large, to help enable the third heat-generating component 15 to be thermally connected to the third cooling region 25, thereby improving efficiency of heat exchange between the third heat-generating component 15 and the third cooling region 25. During specific disposition of the third heat-generating component 15, a second thermal connection layer may be disposed between the third heat-generating component 15 and the third cooling region 25, so that a thermal connection between the third heat-generating component 15 and the third cooling region 25 is implemented by using the second thermal connection layer. The second thermal connection layer may be a thermally conductive layer such as a thermal pad, thermally conductive gel, or thermally conductive adhesive tape. The second thermal connection layer has relatively high thermal conductivity, and can improve efficiency of heat exchange between the third heat-generating component 15 and the third cooling region 25. In addition, the second thermal connection layer is flexible, and can increase a degree of adhesion between the third heat-generating component 15 and the third cooling region 25, increase a heat exchange area, and also improve heat exchange efficiency. The second thermal connection layer can also absorb a tolerance, protect the third heat-generating component 15, and reduce a probability of the third heat-generating component 15 to be damaged by collision. In addition, a cost of the second thermal connection layer is relatively low, to help reduce a cost of the electronic assembly 200.

It is worth noting that, in embodiments of this application, the surface that is of the first cooling region 23 and that faces the first heat-generating component 13 may be a plane. Alternatively, when the electronic assembly 200 includes a plurality of the first heat-generating components 13, and heights of the plurality of the first heat-generating components 13 are different, heights of different regions in the first cooling region 23 may also be different. In other words, the surface that is of the first cooling region 23 and that faces the first heat-generating component 13 may be located on different planes, mainly to ensure that a gap between the first cooling region 23 and the first heat-generating component 13 is a preset distance, thereby shortening a thermal conduction path between the first cooling region 23 and the first heat-generating component 13, and improving an effect of dissipating heat for the first heat-generating component 13.

Similarly, the surface that is of the second cooling region 24 and that faces the second heat-generating component 14 may also be a plane. Alternatively, when the electronic assembly 200 includes a plurality of the second heat-generating components 14, and heights of the plurality of second heat-generating components 14 are different, heights of different regions in the second cooling region 24 may also be different. In other words, the surface that is of the second cooling region 24 and that faces the second heat-generating component 14 may be located on different planes, mainly to ensure that a gap between the second cooling region 24 and the second heat-generating component 14 is a preset distance, thereby shortening a thermal conduction path between the second cooling region 24 and the second heat-generating component 14, and improving an effect of dissipating heat for the second heat-generating component 14.

Similarly, the surface that is of the third cooling region 25 and that faces the third heat-generating component 15 may also be a plane. Alternatively, when the electronic assembly 200 includes a plurality of the third heat-generating components 15, and heights of the plurality of third heat-generating components 15 are different, heights of different regions in the third cooling region 25 may also be different. In other words, the surface that is of the third cooling region 25 and that faces the third heat-generating component 15 may be located on different planes, mainly to ensure that a gap between the third cooling region 25 and the third heat-generating component 15 is a preset distance, thereby shortening a thermal conduction path between the third cooling region 25 and the third heat-generating component 15, and improving an effect of dissipating heat for the third heat-generating component 15.

In a specific embodiment, the liquid cold plate 2 includes a plurality of passageways, where an extension direction of the passageway intersects with a direction in which the liquid inlet 21 faces the liquid outlet 22. Further, the extension direction of the passageway is perpendicular to the direction in which the liquid inlet 21 faces the liquid outlet 22. Specifically, the plurality of passageways may be sequentially connected in series, and columnar teeth 28 are disposed between two adjacent passageways. Disposing the columnar teeth 28 between two adjacent passageways is equivalent to disposition at a turning point of the liquid-cooling working medium, so that a speed and a temperature of the cooling working medium are relatively uniform at each turning point. There is a separation rib between the passageways, where the separation rib may be fastened by using a welding process, so that this solution can avoid long-term high-speed impact of the cooling working medium on a welding seam, thereby improving structural reliability of the liquid cold plate 2.

Figure 16:
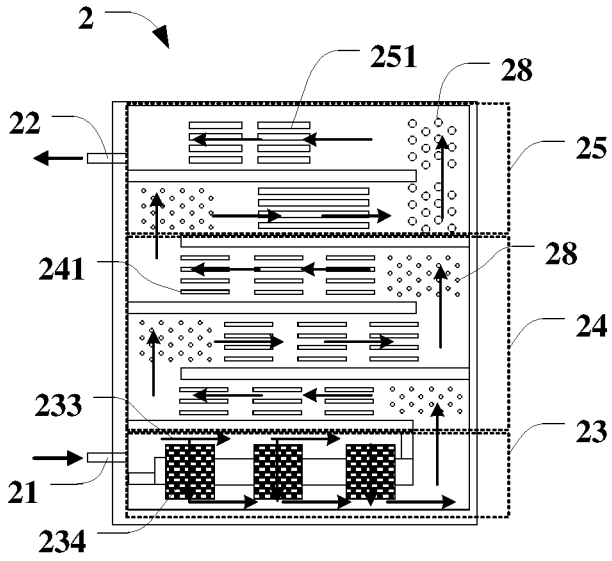
FIG. 16 is another schematic diagram of a structure of a liquid cold plate according to an embodiment of this application.

FIG. 16 is another schematic diagram of a structure of a liquid cold plate according to an embodiment of this application. As shown in FIG. 16, the circuit board assembly 1 includes at least two first heat-generating components 13, and the first cooling region 23 includes a main passageway 233 and at least two sub-passageways 234. Each sub-passageway 234 is connected to the main passageway 233, and adjacent sub-passageways 234 are disposed in parallel. Therefore, temperatures of the cooling working medium in the sub-passageways 234 are relatively close to each other, and heat dissipation capabilities of the sub-passageways 234 are close to each other. The sub-passageways 234 are thermally connected to the first heat-generating components 13 in a one-to-one correspondence manner, so that the first cooling region 23 has relatively close capabilities of dissipating heat for the first heat-generating components 13. In addition, lengths of the sub-passageways 234 are relatively short, and flow resistance of the cooling working medium in the sub-passageways 234 is relatively small, helping improve a flow rate of the cooling working medium and improve heat exchange efficiency.

In a specific embodiment, the electronic device in embodiments of this application may be a charging pile, and the electronic assembly 200 is a charging module. In this scenario, the first heat-generating component 13 may be an electronic assembly whose heat-generating density is relatively high, such as an insulated gate bipolar transistor (IGBT) module; the second heat-generating component 14 may be an electronic assembly whose heat-generating density is medium, such as a transformer, an inductor, or a capacitor; and the third heat-generating component 15 may be an electronic assembly whose heat-generating density is relatively low, such as a relay, a fuse, or a component mounted on a surface of the board.

The foregoing descriptions are merely specific implementations of this application, but the protection scope of this application is not limited thereto. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An electronic assembly, comprising:
   a circuit board assembly;
   a spoiler, wherein the spoiler comprises a plurality of protrusion structures; and
   a liquid cold plate;
   wherein the circuit board assembly comprises a board, a first heat-generating component, and a second heat-generating component;
   wherein the first heat-generating component and the second heat-generating component are disposed on the board, and a heat-generating density of the first heat-generating component is greater than that of the second heat-generating component;
   wherein the liquid cold plate comprises a liquid inlet and a liquid outlet, and a cooling working medium flows into the liquid cold plate from the liquid inlet and flows out of the liquid cold plate from the liquid outlet;
   wherein the liquid cold plate comprises a first cooling region and a second cooling region, the second cooling region is closer to the liquid outlet than the first cooling region, the first heat-generating component is thermally connected to the first cooling region, and the second heat-generating component is thermally connected to the second cooling region; and
   wherein the first cooling region comprises a plurality of fourth heat dissipation fins, each protrusion structure in the plurality of protrusion structures and each fourth heat dissipation fin in the plurality of fourth heat dissipation fins are sequentially disposed spaced from each other, and there is a preset gap between a protrusion structure and a fourth heat dissipation fin that are adjacent.

2. The electronic assembly according to claim 1, wherein there are a plurality of first heat dissipation fins in the first cooling region, there are a plurality of second heat dissipation fins in the second cooling region, and a density of the plurality of first heat dissipation fins is greater than that of the plurality of second heat dissipation fins.

3. The electronic assembly according to claim 1, wherein each protrusion structure in the plurality of protrusion structures is a trapezoidal tooth or a cambered tooth.

4. The electronic assembly according to claim 1,
   wherein the liquid cold plate comprises a die-cast liquid cold plate and a cover plate, and the die-cast liquid cold plate is covered by the cover plate to form a passageway; and
   wherein the spoiler comprises a positioning piece, the positioning piece is connected to the die-cast liquid cold plate in a position limiting manner, and the spoiler is crimped between the cover plate and the die-cast liquid cold plate.

5. The electronic assembly according to claim 2, wherein a distance between two surfaces that are of the first cooling region and the first heat-generating component and that face each other is less than or equal to 0.1 mm.

6. The electronic assembly according to claim 5, wherein the first heat-generating component is thermally connected to the first cooling region by using a first thermal connection layer.

7. The electronic assembly according to claim 2, wherein a gluing groove is disposed on a side that is of the second cooling region and that faces the second heat-generating component, the second heat-generating component is located in the gluing groove, and the second heat-generating component is thermally connected to the gluing groove by using pouring sealant.

8. The electronic assembly according to claim 7, wherein one second heat-generating component is accommodated in one gluing groove.

9. The electronic assembly according to claim 7, wherein a gap between the second heat-generating component and the gluing groove is less than or equal to a preset width.

10. The electronic assembly according to claim 2,
    wherein the circuit board assembly further comprises a third heat-generating component, the third heat-generating component is disposed on the board, and the heat-generating density of the second heat-generating component is greater than that of the third heat-generating component; and
    wherein the liquid cold plate further comprises a third cooling region, the third cooling region and the first cooling region are respectively located on two sides of the second cooling region, and the third heat-generating component is thermally connected to the third cooling region.

11. The electronic assembly according to claim 10, wherein a distance between two surfaces that are of the third cooling region and the third heat-generating component and that face each other is less than or equal to 2.5 mm.

12. The electronic assembly according to claim 11, wherein the third heat-generating component is thermally connected to the third cooling region by using a second thermal connection layer.

13. The electronic assembly according to a claim 2,
    wherein the liquid cold plate comprises a plurality of passageways, and an extension direction of the passageway intersects with a direction in which the liquid inlet faces the liquid outlet; and
    wherein the plurality of passageways are sequentially connected in series, and columnar teeth are disposed between two adjacent passageways.

14. The electronic assembly according to claim 2, wherein the circuit board assembly comprises at least two first heat-generating components, the first cooling region comprises a main passageway and at least two sub-passageways, the at least two sub-passageways are thermally connected to the at least two first heat-generating components in a one-to-one correspondence manner, and the at least two sub-passageways are separately connected to the main passageway.

15. The electronic assembly according to claim 2, wherein the electronic assembly is a charger.

16. A charging pile, comprising:
    a housing; and
    a plurality of electronic assemblies, wherein electronic assemblies in the plurality of electronic assemblies are installed inside the housing;
    wherein each electronic assembly in the plurality of electronic assemblies comprises a circuit board assembly, a spoiler, and a liquid cold plate, wherein the spoiler comprises a plurality of protrusion structures, wherein the circuit board assembly comprises a board, a first heat-generating component, and a second heat-generating component, wherein the first heat-generating component and the second heat-generating component are disposed on the board, and a heat-generating density of the first heat-generating component is greater than that of the second heat-generating component, wherein the liquid cold plate comprises a liquid inlet and a liquid outlet, and a cooling working medium flows into the liquid cold plate from the liquid inlet and flows out of the liquid cold plate from the liquid outlet;

wherein the liquid cold plate comprises a first cooling region and a second cooling region, the second cooling region is closer to the liquid outlet than the first cooling region, the first heat-generating component is thermally connected to the first cooling region, and the second heat-generating component is thermally connected to the second cooling region; and wherein the first cooling region comprises a plurality of fourth heat dissipation fins, each protrusion structure in the plurality of protrusion structures and each fourth heat dissipation fin in the plurality of fourth heat dissipation fins are sequentially disposed spaced from each other, and there is a preset gap between a protrusion structure and a fourth heat dissipation fin that are adjacent.

17. The charging pile according to claim 16, wherein, for each electronic assembly in the plurality of electronic assemblies, there are a plurality of first heat dissipation fins in the first cooling region, there are a plurality of second heat dissipation fins in the second cooling region, and a density of the plurality of first heat dissipation fins is greater than that of the plurality of second heat dissipation fins.

* * * * *